US012031909B2

(12) United States Patent
Cottaar

(10) Patent No.: US 12,031,909 B2
(45) Date of Patent: Jul. 9, 2024

(54) METROLOGY METHOD FOR MEASURING AN EXPOSED PATTERN AND ASSOCIATED METROLOGY APPARATUS

(71) Applicant: ASML Netherlands B.V., Veldhoven (NL)

(72) Inventor: Jeroen Cottaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/021,885

(22) PCT Filed: Jul. 20, 2021

(86) PCT No.: PCT/EP2021/070261
§ 371 (c)(1),
(2) Date: Feb. 17, 2023

(87) PCT Pub. No.: WO2022/037877
PCT Pub. Date: Feb. 24, 2022

(65) Prior Publication Data
US 2023/0366815 A1 Nov. 16, 2023

(30) Foreign Application Priority Data
Aug. 20, 2020 (EP) .................................. 20192002

(51) Int. Cl.
*G01N 21/47* (2006.01)
*G01N 21/95* (2006.01)
(52) U.S. Cl.
CPC ..... *G01N 21/4738* (2013.01); *G01N 21/9501* (2013.01)

(58) Field of Classification Search
CPC .................................................. G03F 7/70616
See application file for complete search history.

(56) References Cited

U.S. PATENT DOCUMENTS 4,769,551 A 9/1988 Hamashima et al.
6,952,253 B2 10/2005 Lof et al.
(Continued)

FOREIGN PATENT DOCUMENTS

CN 101515105 B 7/2010
EP 1 628 164 A2 2/2006
(Continued)

OTHER PUBLICATIONS

International Search Report and Written Opinion of the International Searching Authority directed to International Patent Application No. PCT/EP2021/070261, dated Sep. 30, 2021; 11 pages.
(Continued)

*Primary Examiner* — Tony Ko
(74) *Attorney, Agent, or Firm* — Sterne, Kessler, Goldstein & Fox P.L.L.C.

(57) ABSTRACT

Disclosed is a method for performing a measurement of an exposed pattern in photoresist on a substrate and an associated metrology device. The method comprises imparting a beam of measurement radiation on said exposed pattern over a measurement area of a size which prevents or mitigates photoresist damage from the measurement radiation; capturing scattered radiation comprising said measurement radiation subsequent to it having been scattered from said exposed pattern and detecting the scattered radiation on at least one detector. A value for a parameter of interest is determined from the scattered radiation.

15 Claims, 5 Drawing Sheets

(56) References Cited

U.S. PATENT DOCUMENTS

| | | | |
|---|---|---|---|
| 7,502,103 | B2 | 3/2009 | Plug et al. |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 8,885,150 | B2 | 11/2014 | Pellemans et al. |
| 10,067,074 | B2 | 9/2018 | Quintanilha et al. |
| 10,451,559 | B2 | 10/2019 | Van Voorst et al. |
| 2006/0066855 | A1 | 3/2006 | Boef et al. |
| 2007/0224518 | A1 | 9/2007 | Yokhin et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0100427 | A1 | 4/2013 | Koolen et al. |
| 2013/0162996 | A1 | 6/2013 | Straaijer et al. |
| 2013/0304424 | A1 | 11/2013 | Bakeman et al. |
| 2014/0019097 | A1 | 1/2014 | Bakeman et al. |
| 2016/0161863 | A1 | 6/2016 | Den Boef et al. |
| 2016/0282282 | A1 | 9/2016 | Quintanilha et al. |
| 2016/0370717 | A1 | 12/2016 | Den Boef et al. |
| 2017/0184981 | A1 | 6/2017 | Quintanilha et al. |
| 2019/0003988 | A1 | 1/2019 | Solarz et al. |
| 2019/0215940 | A1 | 7/2019 | Khodykin et al. |
| 2020/0356013 | A1 | 11/2020 | Van Dongen et al. |
| 2023/0305407 | A1* | 9/2023 | Liu .............. G03F 7/706851 250/372 |

FOREIGN PATENT DOCUMENTS

| | | |
|---|---|---|
| EP | 3 629 086 A1 | 4/2020 |
| JP | 2001-304818 A | 10/2001 |
| JP | 2011-103177 A | 5/2011 |
| JP | 2019-529953 A | 10/2019 |
| JP | 2020-534558 A | 11/2020 |
| NL | 2025095 A | 5/2020 |
| TW | 2017-02750 A | 1/2017 |
| WO | WO 2009/129974 A1 | 10/2009 |
| WO | WO 2011/012624 A1 | 2/2011 |

OTHER PUBLICATIONS

International Preliminary Report on Patentability directed to International Patent Application No. PCT/EP2021/070261, dated Feb. 16, 2023; 8 pages.

Lemaillet et al., "Intercomparison between optical and x-ray scatterometry measurements of FinFET structures," Proc. of SPIE, vol. 8681, Metrology, Inspection, and Process Control for Microlithography XXVII, Apr. 10, 2013; 8 pages.

Scholze et al., "The influence of line edge roughness and CD uniformity on EUV scatterometry for CD characterization of EUV masks," Proc. of SPIE, vol. 6617, Modeling Aspects in Optical Metrology, Jun. 18, 2007; 10 pages.

Japanese Search Report directed to Japanese Patent Application No. 2023-512193, mailed Mar. 15, 2024; 25 pages.

* cited by examiner

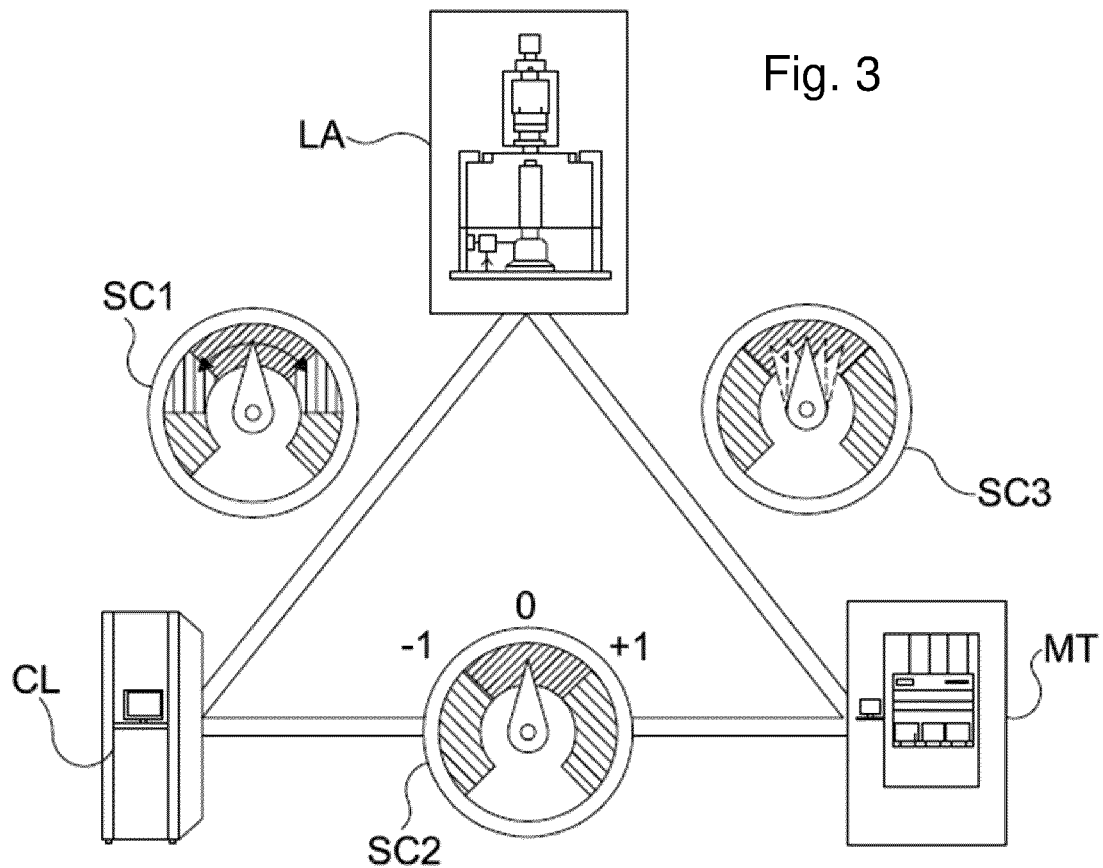
Fig. 3
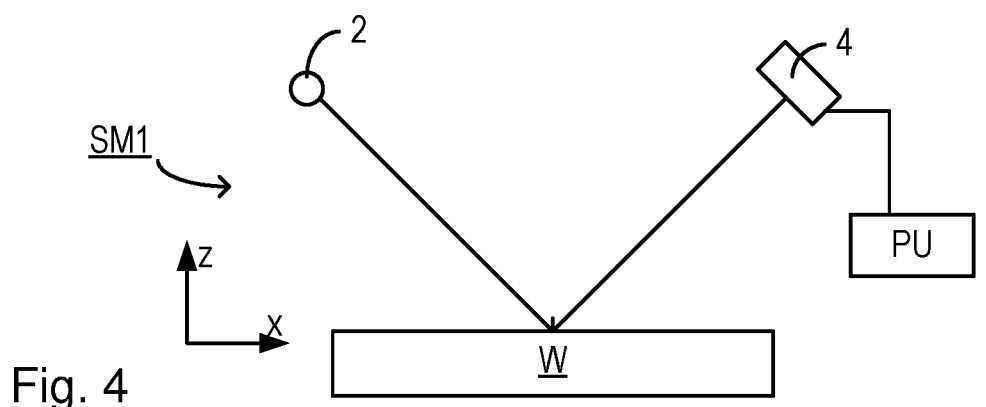
Fig. 4
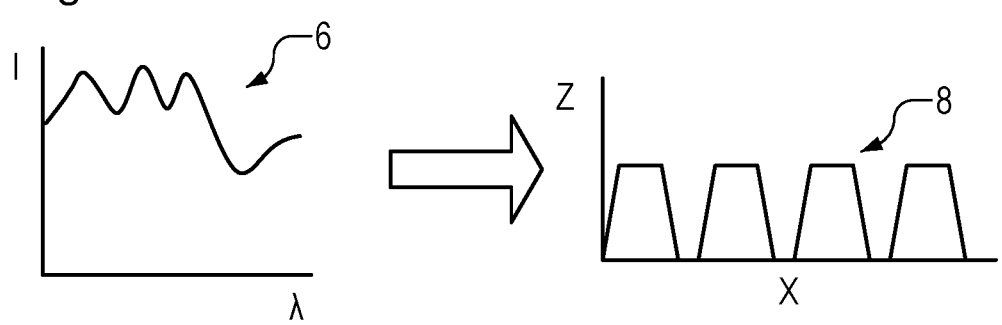

METROLOGY METHOD FOR MEASURING AN EXPOSED PATTERN AND ASSOCIATED METROLOGY APPARATUS

CROSS REFERENCE TO RELATED APPLICATIONS

This application claims priority of EP application 20192002.2 which was filed on 2020 Aug. 20 and which is incorporated herein in its entirety by reference.

FIELD

The present invention relates to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-infrared (IR) wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

As such, it is advantageous to extract certain parameters of interest, such as overlay, from targets of which the grating width is similar to the critical dimensions of the stack. In this context, targets may comprise metrology targets formed for the purpose of measurement or actual product structure having a form (e.g., sufficient reciprocity) such that it may be measured to derive a parameter of interest. As such, the term "target", "metrology target" or "overlay target" throughout this text should explicitly be understood to encompass metrology targets formed expressly for the purpose of metrology and/or product structures having a form suitable for metrology. A promising method to do this is to use hard X-ray (HXR) radiation, soft X-ray (SXR) radiation and/or using extreme ultraviolet (EUV) radiation (e.g. with a wavelength in a range from 10-20 nm). However, reaction of e.g., the SXR or (EUV) radiation with hydrocarbons is expected to lead to material deposition, e.g. carbon deposition, on the targets during their exposure.

It is also advantageous to measure overlay on after-development inspection (ADI) targets, on which the top grating exists in developed photoresist only. However, the exposure of such ADI targets to e.g. SXR or EUV radiation leads to exposure of the resist, which is expected to result in changes of the resist, in particular to shrinkage of the resist.

Material deposition, optionally carbon deposition, resist shrinkage and/or other resist damage may be termed target drift. As such, target drift may be defined as a structural change of the target due to illumination. This may affect the intensity of the −1st and +1st (or higher order) diffraction orders, and may therefore affect measured intensity asymmetry. If asymmetry is affected, this will in turn affect (e.g. deteriorate) the accuracy of determined overlay. Determined overlay may therefore be different to the actual overlay due to target drift.

It will be apparent also, that the problem of target drift is particularly acute when performing metrology on actual product structures, as this can result in a structural change or damage to the actual product.

For this reason methods to mitigate or prevent target drift are desired.

SUMMARY

Therefore, in a first aspect of the invention, there is provided a method of performing a measurement of an exposed pattern in photoresist on a substrate, the method comprising: imparting a beam of measurement radiation on said exposed pattern over a measurement area of a size which prevents or mitigates photoresist damage from the measurement radiation, the beam of measurement radiation forming a measurement spot on the substrate; capturing scattered radiation comprising said measurement radiation subsequent to it having been scattered from said exposed pattern; detecting the scattered radiation on at least one detector; and determining a value for a parameter of interest from the scattered radiation.

In a second aspect of the invention there is provided a metrology device for performing a measurement of an exposed pattern in photoresist on a substrate, the metrology device comprising: an illumination system operable to imparting a beam of measurement radiation on said exposed pattern over a measurement area of a size which prevents or mitigates photoresist damage from the measurement radiation and such that the beam of measurement radiation forms a measurement spot on the substrate; at least one detector operable to detect scattered radiation comprising said measurement radiation subsequent to it having been scattered from said exposed pattern; and a processor operable to determine a value for a parameter of interest from the scattered radiation.

In other aspects of the invention, there is provided a computer program comprising program instructions operable to perform the method of the first aspect when run on a suitable apparatus.

BRIEF DESCRIPTION OF THE DRAWINGS

Embodiments will now be described, by way of example only, with reference to the accompanying schematic drawings, in which:

FIG. 3 depicts a schematic representation of holistic lithography, representing a cooperation between three key technologies to optimize semiconductor manufacturing;

FIG. 4 schematically illustrates a scatterometry apparatus;

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
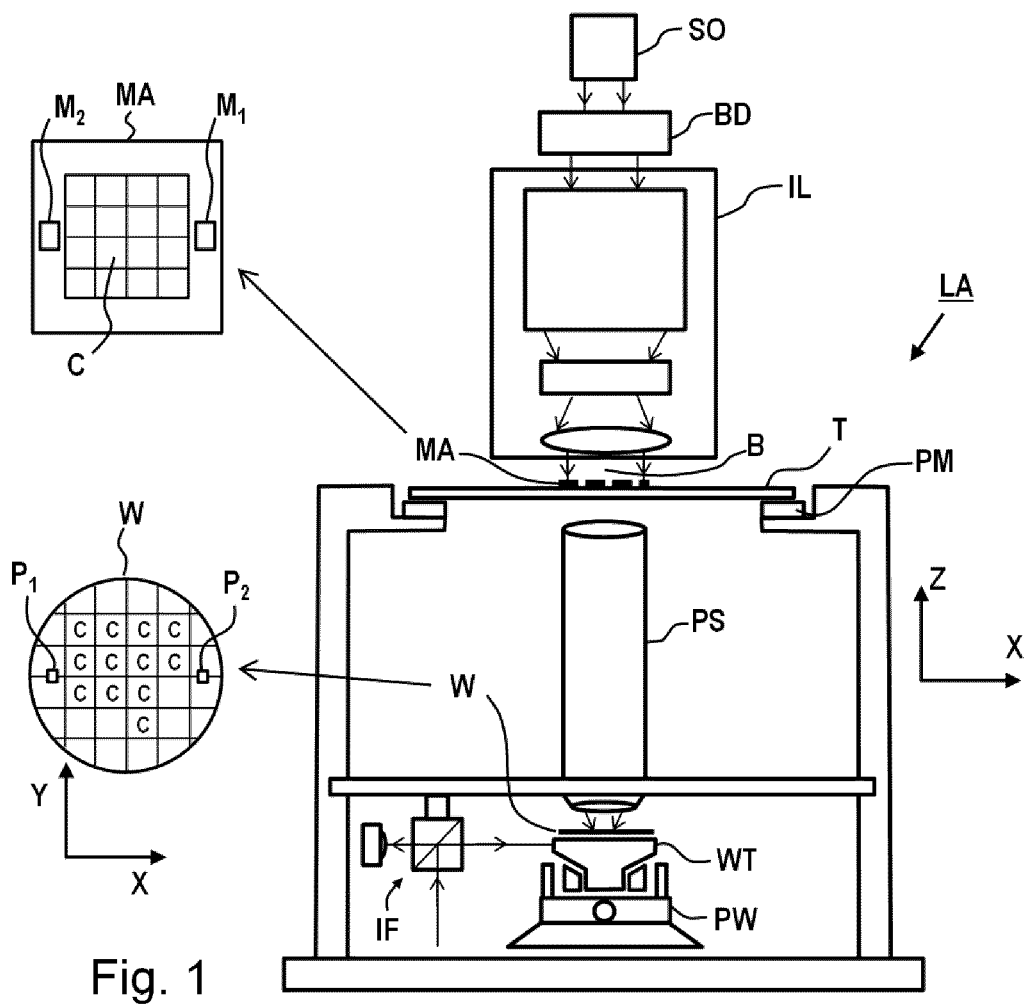
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
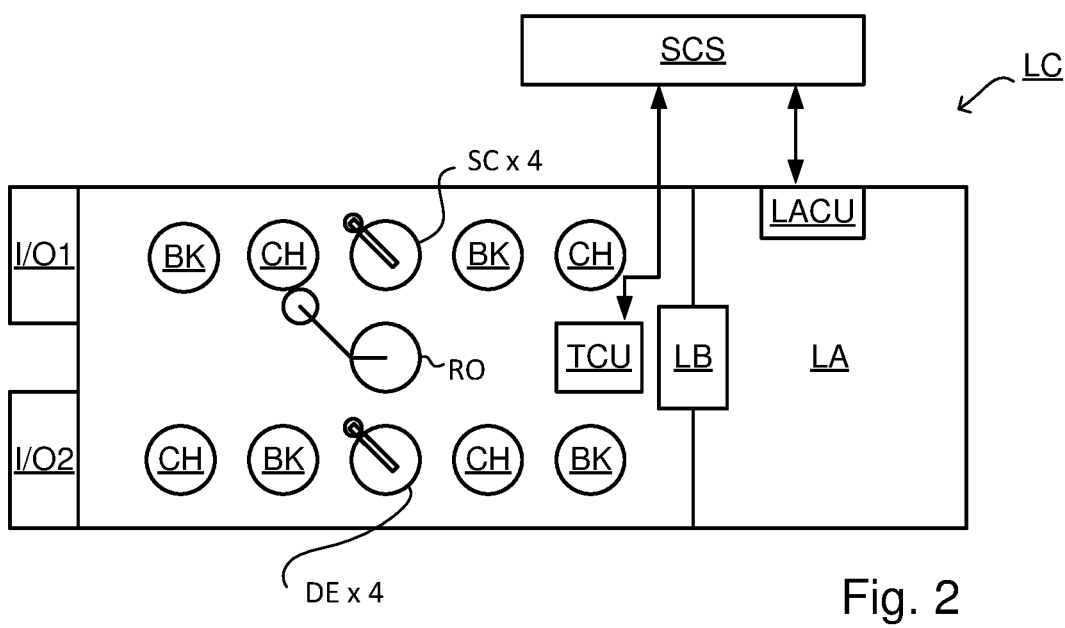
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from hard X-ray, soft X-ray, extreme ultraviolet and visible to near-IR wavelength range. In case that the radiation is hard X-ray or soft X-ray, optionally with a wavelength ranging from 0.01 to 10 nm, the aforementioned scatterometers may optionally be a small-angle X-ray scattering metrology tool.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), shape of structures, etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected, transmitted or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered or transmitted radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920, 968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in or close to the pupil plane or a conjugate plane with the pupil of the objective of the scatterometer, measurements usually referred as pupil based measurements, or by having the sensor in or close to the image plane or a plane conjugate with the image plane, in which case the measurements are usually referred as image or field based measurements. Such scatterometers and the associated measurement techniques are further described in patent applications US20100328655, US2011102753A1, US20120044470A, 0520110249244, 0520110026032 or EP1,628,164A, incorporated herein by reference in their entirety. Aforementioned scatterometers may measure in one image multiple targets from multiple gratings using light from hard X-ray, soft X-ray, extreme ultraviolet, visible to near-IR and IR wave range.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use hard X-ray, soft X-rays or EUV radiation, for example radiation with at least one of the wavelength ranges: <0.01 nm, <0.1 nm, <1 nm, between 0.01 nm and 100 nm, between 0.01 nm and 50 nm, between 1nm and 50 nm, between 1nm and 20 nm, between 5 nm and 20 nm, and between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. It is noted that the use of laser produced plasma (LPP) x-ray source is described in U.S. Patent Publication No. 2019/003988A1, and in U.S. Patent Publication No. 2019/215940A1, which are incorporated herein by reference in the entirety. Reflectometry techniques using X-rays (GI-XRS) and extreme ultraviolet (EUV) radiation at grazing incidence may be used for measuring properties of films and stacks of layers on a substrate. Within the general field of reflectometry, goniometric and/or spectroscopic techniques may be applied. In goniometry, the variation of a reflected beam with different incidence angles may be measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

Figure 5:
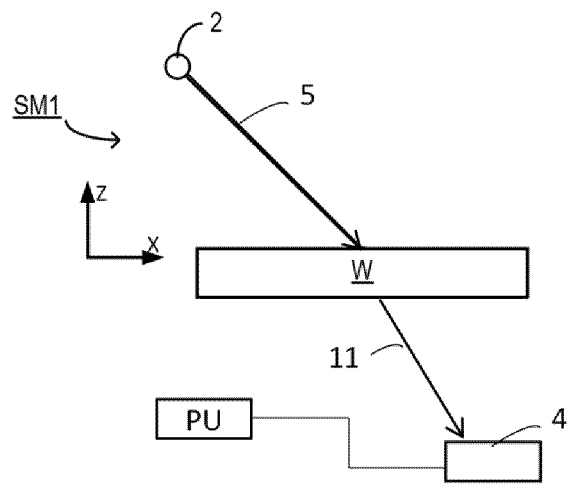
FIG. 5 schematically illustrates a transmissive scatterometry apparatus.

A transmissive version of the example of a metrology apparatus, such as a scatterometer shown in FIG. 4, is depicted in FIG. 5. The transmitted radiation 11 is passed to a spectrometer detector 4, which measures a spectrum 6 as discussed for FIG. 4. Such a scatterometer may be configured as a normal-incidence scatterometer or an oblique-incidence scatterometer.

It is possible that the range of application makes the use of wavelengths in e.g. the soft X-rays or EUV domain not sufficient. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent applications are incorporated herein by reference in their entirety.

Figure 6:
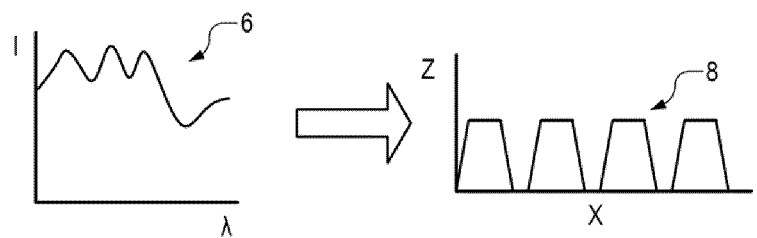
FIG. 6 depicts a schematic representation of a metrology apparatus in which EUV and/or SXR radiation is used.
Figure 6:
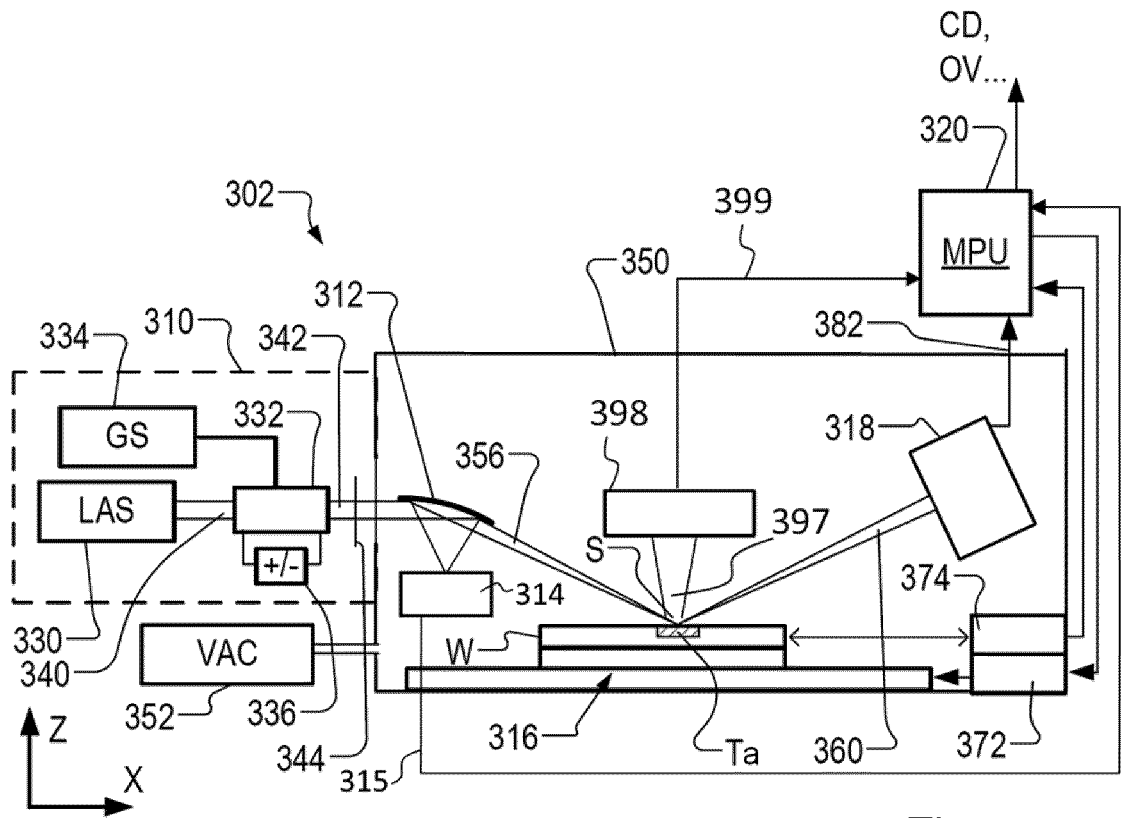

FIG. 6 depicts a schematic representation of a metrology apparatus 302 in which radiation in the wavelength range from 0.01 nm to 100 nm may be used to measure parameters of structures on a substrate. The metrology apparatus 302 presented in FIG. 6 may be suitable for the hard X-ray, soft X-rays or EUV domain.

FIG. 6 illustrates a schematic physical arrangement of a metrology apparatus 302 comprising a spectroscopic scatterometer using hard X-ray (HXR) and/or Soft X-Ray (SXR) and/or EUV radiation optionally in grazing incidence, purely by way of example. An alternative form of inspection apparatus might be provided in the form of an angle-resolved scatterometer, which may use radiation in normal or near-normal incidence similar to the conventional scatterometers operating at longer wavelengths, and which may also use radiation with direction being greater than 1° or 2° from a direction parallel to the substrate. An alternative form of inspection apparatus might be provided in the form of a transmissive scatterometer, to which the configuration in FIG. 5 applies.

Inspection apparatus 302 comprises a radiation source or called illumination source 310, illumination system 312, substrate support 316, detection systems 318, 398 and metrology processing unit (MPU) 320.

An illumination source 310 in this example is for a generation of EUV, hard X-ray or soft X-ray radiation. The illumination source 310 may be based on high harmonic generation (HHG) techniques as shown in FIG. 6, and it may also be other types of illumination sources, e.g. liquid metal jet source, inverse Compton scattering (ICS) source, plasma channel source, magnetic undulator source, free electron laser (FEL) source, compact storage ring source, electrical discharge produced plasma source, soft X-ray laser source, rotating anode source, solid anode source, particle accelerator source, microfocus source, or laser produced plasma source.

The HHG source may be a gas jet/nozzle source, a capillary/fiber source or a gas cell source.

For the example of HHG source, as shown in FIG. 6, main components of the radiation source are a pump radiation source 330 operable to emit the pump radiation and a gas delivery system 332. Optionally the pump radiation source 330 is a laser, optionally the pump radiation source 330 is a pulsed high-power infrared or optical laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 µm (1 micron). Optionally, the laser pulses are delivered as a first pump radiation 340 to the gas delivery system 332, where in the gas a portion of the radiation is converted to higher frequencies than the first radiation into an emitted radiation 342. A gas supply 334 supplies a suitable gas to the gas delivery system 332, where it is optionally ionized by an electric source 336. The gas delivery system 332 may be a cut tube. A gas provided by the gas delivery system 332 defines a gas target, which may be a gas flow or a static volume. The gas may be for example a noble gas such as neon (Ne), helium (He) or argon (Ar). $N_2$, $O_2$, Ar, Kr, Xe gases may all be considered. These may be selectable options within the same apparatus.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific wavelengths from among those generated. Optionally some or all of the beam path may be contained within a vacuum environment, bearing in mind that SXR and/or EUV radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 0.01-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm may provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. Optionally the atmosphere within inspection chamber 350 maybe maintained near vacuum by vacuum pump 352, so that SXR and/or EUV radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 µm in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a hard X-ray, soft X-ray and/or EUV spectroscopic reflectometer of the kind described in US2016282282A1 which content is incorporated herein by reference in its entirety.

If the target Ta has a certain periodicity, the radiation of the focused beam 356 may be partially diffracted as well. The diffracted radiation 397 follows another path at well-defined angles with respect to the angle of incidence then the reflected radiation 360. In FIG. 6, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 6 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target Ta are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses hard X-ray, soft X-ray and/or EUV radiation optionally at normal incidence or near-normal incidence, for example to perform diffraction-based measurements of asymmetry. Another alternative form of inspection apparatus uses hard X-ray, soft X-ray and/or EUV radiation with direction being greater than 1° or 2° from a direction parallel to the substrate. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The hard X-ray, soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV, hard X-ray (HXR) and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) or inverse Compton scattering (ICS) to obtain radiation at the desired wavelength(s).

Figure 7:
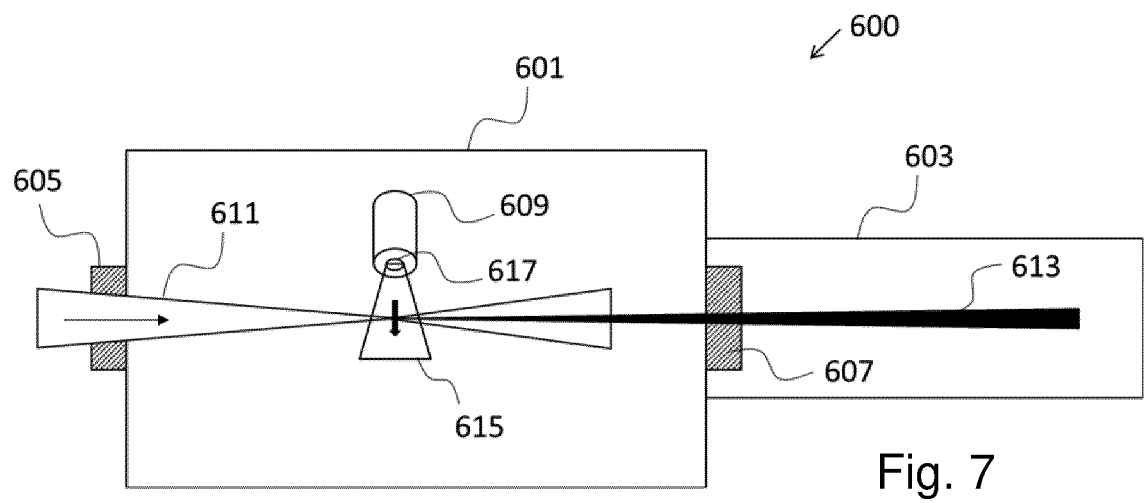
FIG. 7 depicts a schematic representation of an illumination source for high harmonic generation.

FIG. 7 shows a simplified schematic drawing of an embodiment 600 of an illumination source 310, which may be the illumination source for high harmonic generation (HHG). One or more of the features of the illumination source in the metrology tool described with respect to FIG. 6 may also be present in the illumination source 600 as appropriate. The illumination source 600 comprises a chamber 601 and is configured to receive a pump radiation 611 with a propagation direction which is indicated by an arrow. The pump radiation 611 shown here is an example of the pump radiation 340 from the pump radiation source 330, as shown in FIG. 6. The pump radiation 611 may be directed into the chamber 601 through the radiation input 605, which maybe a viewport, optionally made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume (for example several cubic mm) of a particular gas (e.g., a noble gas, optionally Helium, Argon, or Neon, nitrogen, oxygen or carbon dioxide) in which the gas pressure is above a certain value. The gas flow 615 may be a steady flow. Other media, such as metallic plasmas (e.g. aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). Optionally, the gas flow 615 is provided by the gas delivery system into an evacuated or nearly evacuated space. The gas delivery system may comprise a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B.

The dimensions of the gas nozzle 609 may conceivably also be used in scaled-up or scaled-down versions ranging from micrometer-sized nozzles to meter-sized nozzles. This wide range of dimensioning comes from the fact that the setup should be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules. Optionally, the gas nozzle 609 has a thicker wall to reduce nozzle deformation caused by the thermal expansion effect, which may be detected by e.g. a camera. The gas nozzle with thicker wall may produce a stable gas volume with reduced variation. Optionally, the illumination source comprises a gas catcher which is close to the gas nozzle to maintain the pressure of the chamber 601.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 6. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 6, to a substrate to be inspected for metrology measurements. The emitted radiation 613 may be guided, optionally focused, to a target on the substrate.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 6 into the radiation output 607, which is placed in the emitted beam path and that is opaque or nearly opaque to the pump radiation (e.g. opaque or nearly opaque to infrared or visible light) but at least partially transparent to the emitted radiation beam. The filter may be manufactured using zirconium or multiple materials combined in multiple layers. The filter may be a hollow, optionally an annular, block when the pump radiation 611 has a hollow, optionally an annular, transversal cross-sectional profile. Optionally, the filter is non-perpendicular and non-parallel to propagation direction of the emitted radiation beam to have efficient pump radiation filtering. Optionally, the filtering device 344 comprise a hollow block and a thin membrane filter such as an Aluminum (Al) or Zirconium (Zr) membrane filter.

Described herein are methods, apparatuses, and assemblies to obtain emitted radiation optionally at a high harmonic frequency of pump radiation. The radiation generated through the process, optionally the HHG which uses non-linear effects to generate radiation at a harmonic frequency of provided pump radiation, may be provided as radiation in metrology tools MT for inspection and/or measurement of substrates. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration in the femtosecond range.

For some embodiments, the emitted radiation, optionally the high harmonic radiation, may comprise one or more harmonics of the pump radiation wavelength(s). The emitted radiation may comprise wavelengths in the extreme ultra-violet (EUV), soft X-Ray (SXR), and/or hard X-Ray (HXR) part of the electromagnetic spectrum. The emitted radiation 613 may comprise wavelengths in the range of 0.01 nm to 100 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a structure on the substrate. Using radiation at shorter wavelengths, for example at EUV, SXR and/or HXR wavelengths as comprised in the wavelength ranges described above, may allow for smaller features of a structure to be resolved by the metrology tool, compared to using longer wavelengths (e.g.

visible radiation, infrared radiation). Radiation with shorter wavelengths, such as EUV, SXR and/or HXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUV, SXR and/or HXR radiation. The target structure may reflect, transmit and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders. The metrology tool MT may also measure the specular reflected or transmitted radiation (0th order diffracted radiation). Further sensors for metrology may be present in the metrology tool MT, for example to measure further diffraction orders (e.g. higher diffraction orders).

Generally, methods and apparatus disclosed herein mitigate target drift when measuring a parameter of a structure fabricated in or on a substrate. As stated above, the term "target drift" describes damage or any change to the target due to material deposition and/or changes in the resist, in particular resist shrinkage. Target, in this context, includes dedicated targets and any product structure (or more generally any exposed pattern in resist) which is measurable to determine a value of interest.

After-development inspection (ADI) comprises metrology performed after development but before a following semiconductor manufacturing step optionally before etch; i.e., on the exposed pattern in resist. It has been observed that after illumination of a target (or other structure e.g., product structures) with electromagnetic radiation (e.g., SXR/EUV radiation), an intensity of first-order diffracted radiation from the target is time dependent, and specifically illumination time dependent. That is, the intensity of diffracted radiation is a function of the amount of time that the target has spent under illumination, during which the dose accumulates. This is thought to originate from the above-mentioned target drift contributions, e.g., from material deposition e.g. carbon deposition, and/or resist shrinkage. This time dependent intensity introduces errors in the measured parameter e.g. overlay of the target. Where metrology is performed on product structures, in addition to introducing measurement errors, this may actually damage the product by directly introducing deformation and/or defects.

For DUV lithography process, chemically amplified resist (CAR) may be used and for EUV lithography process, chemically amplified resists (CAR), metal oxide resist (MOR) or chain scission may be used. Regarding damage by e.g. the soft x-rays (e.g. 10-20 nm), if the inspection is done after development, irradiation may lead to shrink of the features due to loss of small organic molecules. To prevent resist damage, in one embodiment, the dose is smaller than 10% of the EUV dose-to-clear/dose-to-gel of the resist, which would bring it in the order of 1 mJ/cm$^2$.

An HXR, SXR or EUV metrology tool performs scatterometry measurements using short wavelengths which can image and decorrelate features that are difficult to resolve using visible wavelengths. Such metrology may comprise ADI at-resolution overlay, where at-resolution refers to the resolution of the measurement having a similar resolution as the product structure (i.e., the target and product structure have similar dimensions). The typical approach is to use as small a measurement spot size (on the wafer) as possible; this allows measurement of small targets. This is because the use of too large a spot leads to two problems: the energy falling outside the target may contaminate the measurement signal, and the energy falling outside the target may damage the resist or device.

In addition to the spot size on the wafer, the spot size on the detectors (e.g., the high-order radiation detectors) may also be controlled; e.g., such that spots of different wavelengths do not overlap to the point that significant spectral resolution is lost. These two spot size constraints are difficult to satisfy simultaneously, since having a small spot on the detector requires having a small beam divergence, which in turn makes it difficult to image a small spot on the wafer.

An advantage of using soft X-ray wavelengths is the ability to measure ADI in-device, provided that a somewhat periodic structure is available, such as DRAM or SRAM, although even an irregular logic area with some underlying pitch may also be suitable. However, this leads to the target drift or resist/device damage problem becoming much more acute; the issue is not only the light falling outside the target, but all of the light used for measurement.

To avoid resist damage, instead of imaging using a small Gaussian spot (on the wafer) of a few μm, it is proposed to uniformly illuminate a measurement area of no smaller than: 100 μm$^2$, 200 μm$^2$, 500 μm$^2$, 1000 μm$^2$, 2500 μm$^2$, 5000 μm$^2$, 0.01 mm$^2$, 0.025 mm$^2$, 0.05 mm$^2$, 0.1 mm$^2$, 0.15 mm$^2$, 0.2 mm$^2$, or 0.25 mm$^2$. For example, the measurement spot may measure an area of about 500×500 μm. For example, the measurement spot may have a diameter (or called spot size) on the wafer equal to or bigger than 10 μm.

The measurement area may be such that the maximum dose received by the measurement area is 0.01 J/cm$^2$, 5 mJ/cm$^2$, 1 mJ/cm$^2$, 0.5 mJ/cm$^2$, 0.1 mJ/cm$^2$ 0.05 mJ/cm$^2$, or 0.01 mJ/cm$^2$.

However, while this may appear simple to implement, it cannot necessarily be achieved by simply demagnifying rather than magnifying the spot, using poor-quality mirrors, or positioning the wafer out of focus. This is because the spot sizes on the detector still need to be sufficiently small to separate the wavelengths on the detector. Also, to keep the measurement area as small as possible given the allowed dose, it is desirable to illuminate the measurement area uniformly.

Therefore, embodiments may comprise measuring with the radiation focused on the detector rather than the wafer or measuring with a rectangular area using a measurement spot which is elongated in one direction. Other embodiments use a smaller or standard size measurement spot but scans this spot over the measurement area of no smaller than: 100 μm', 200 μm', 500 μm', 1000 μm$^2$, 2500 μm$^2$, 5000 μm$^2$, 0.01 mm$^2$, 0.025 mm$^2$, 0.05 mm$^2$, 0.1 mm$^2$, 0.15 mm$^2$, 0.2 mm$^2$, or 0.25 mm$^2$, such that none of the measurement area receives sufficient photons to cause (significant) resist damage.

As such, a method of performing a measurement of an exposed pattern in photoresist on a substrate is described, wherein the method comprises imparting a beam of measurement radiation on said exposed pattern over a measurement area of a size (e.g., according to any of the above examples) which prevents or mitigates photoresist damage from the measurement radiation; capturing scattered radiation comprising said measurement radiation subsequent to it having been scattered from said exposed pattern; and determining a value for a parameter of interest from the scattered radiation.

In a first embodiment, it is proposed to perform a measurement with the radiation focused on the detector rather than the wafer. Therefore, instead of putting the wafer into the focus of the system, the system is tuned such that the beam is not in focus until it hits the detector. The measurement spot is thus defocused, and consequently large, on the wafer. This approach does make it more difficult to focus all colors simultaneously. Typically, this may be done by using a special grating with variable line spacing (used in an SXR reference branch for example); this cannot be done on the measurement area, particularly which this may comprise device structure, rather than a target. It is also difficult to make such an arrangement tunable; to measure a small target, the wafer may be switched in focus which requires a large stage movement. Finally, the measurement area will not illuminated uniformly; rather, the illumination profile there will look like the SXR pupil (typically Gaussian).

To address at least some of these issues, a second embodiment may comprise using a large measurement spot on the wafer which is elongated substantially only in a first direction (or at least is bigger in a first direction). The first direction is orthogonal to a second direction corresponding to the direction on the detector along which different wavelengths of the scattered radiation are spatially separated.

Figure 8:
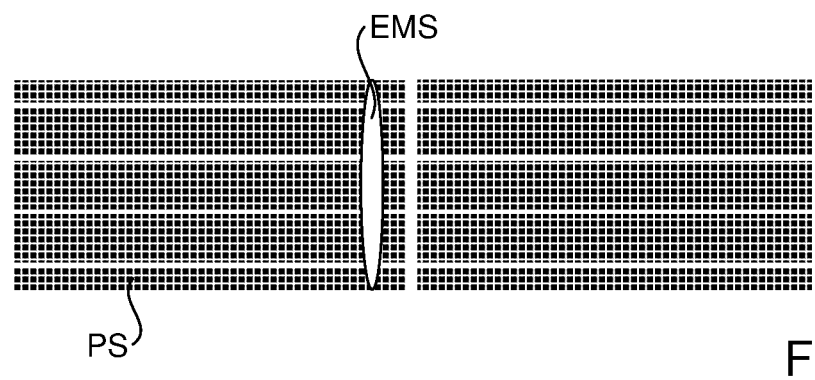
FIG. 8 depicts a schematic representation of a metrology method according to a first embodiment.

FIG. 8 illustrates such an embodiment. It shows an elongated measurement spot EMS measuring product structure PS. This takes advantage of the fact that it is only important for the spot size to be small on the detector in the direction where it overlaps with other wavelengths. Therefore, it is acceptable to allow the spot to be large in the other direction on both the wafer and on the detector.

A downside of this embodiment may be that it does not make the best use of the measurement area available. A square area may be much more attractive to measure than a rectangular area having the same area. In addition this may be still not easily switchable between a small and a large spot, and may still not be very uniformly illuminated (in the second direction).

Figure 9:
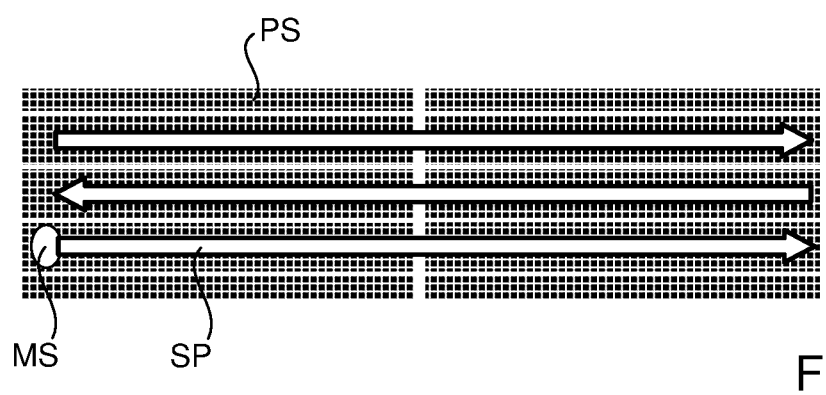
FIG. 9 depicts a schematic representation of a metrology method according to a second embodiment.

FIG. 9 illustrates a more flexible option which comprises using a small measurement spot MS (e.g., comparable to that used presently), but to move the spot around during the exposure; e.g., a scanning measurement along a spot path SP on the structure such that the spot path covers the measurement area, e.g., having dimensions according to the examples described above. The spot path may follow a meander pattern, straight passes or a randomized movement (e.g., by vibrating the stage, so intentionally introducing a moving standard deviation error MSD). For example, the spot path may comprise one or more linear scans; and said one or more scans may comprise a plurality of linear scans joined to form a meander path over the measurement area.

A value for the parameter of interest may be obtained by averaging (e.g., taking the mean of) the detector signals over all the measurements along the scan path SP. It is also possible to capture time-resolved data to obtain a much higher resolution, enabling for example high-resolution imaging of a full die. It should be appreciated that an individual value from a single measurement (i.e., at a single position on the scan path) for the parameter of interest is likely to be very inaccurate due to the lack of photons per individual measurement, however the total amount of information collected will be sufficient.

Figure 10:
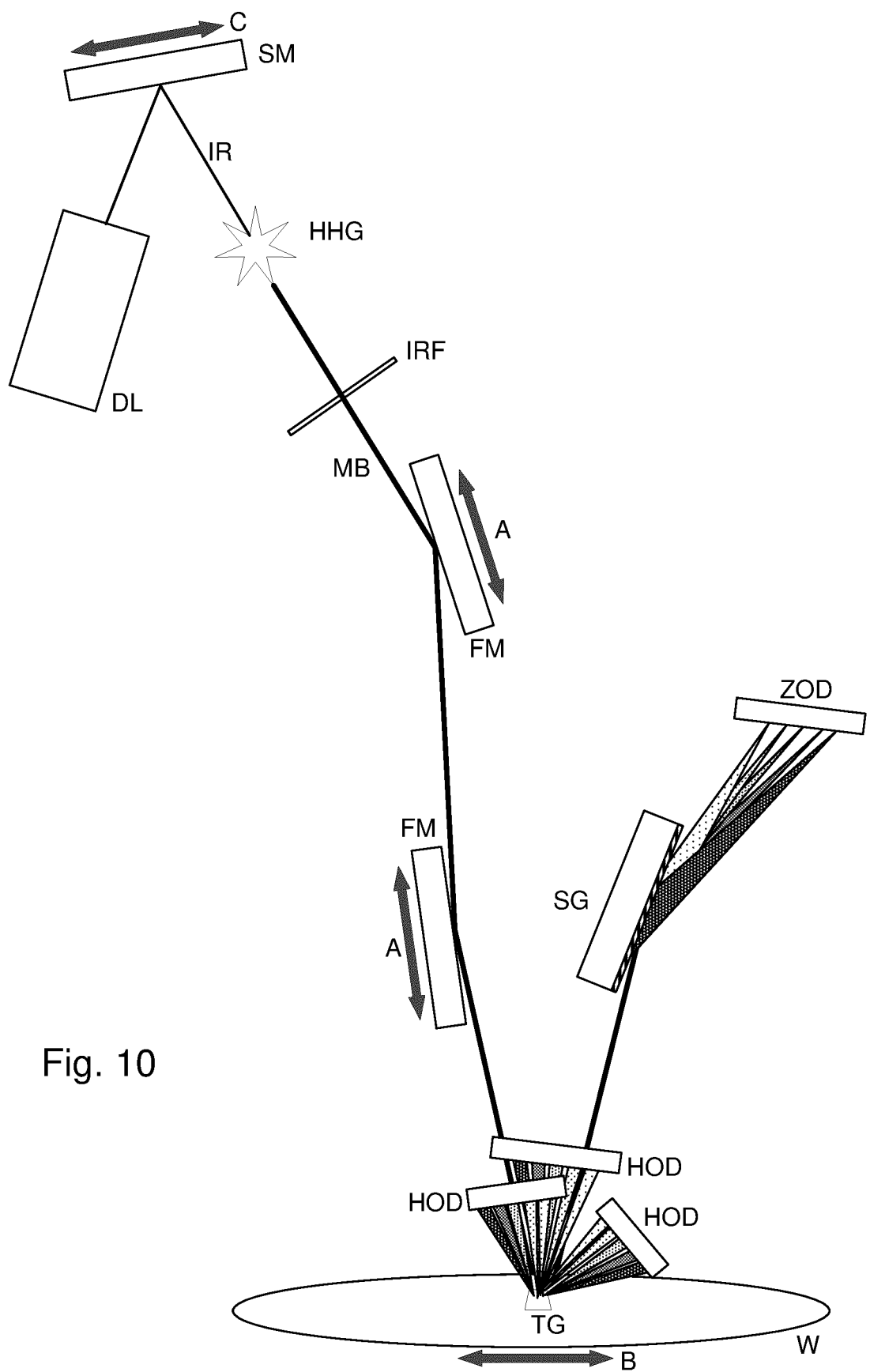
FIG. 10 depicts a schematic representation of a metrology apparatus and depicts three implementations of a metrology method according to a third embodiment.

FIG. 10 is a simplified schematic of a metrology apparatus illustrating a number of proposals for obtaining a moving measurement spot. A drive laser DL, which may be one example of the pump radiation source 330 in FIG. 6, provides the pump radiation 340 from the pump radiation source 330, as shown in FIG. 6, optionally a drive infrared drive radiation IR, which may be steered by (at least one) beam steering element or source mirror SM towards a HHG generation site HHG where it excites a HHG medium, optionally the gas flow 615. The resultant broadband measurement beam MB, which may be the emitted radiation 342, is filtered to remove any infrared by an infrared filter IRF. The filtered beam is then steered and focused by an illumination system or illuminator, which comprises (at least one) beam steering element, here represented by focusing mirrors FM, onto a target TG on wafer W. Scattered radiation in the form of higher diffraction orders, e.g., +1/−1 diffraction orders (comprising multiple wavelengths—here different shading depicts different colors) is captured on one or more higher order detectors HOD. The specular radiation may be dispersed via dispersion element such as a spectrometer grating SG and the resultant spectrally resolved zeroth order radiation may be captured on zeroth order detector ZOD. Note that this is purely an illustrative example and not all features are necessary (e.g., depending on the metrology method, the apparatus may be configured to only capture higher order diffraction). Also, the concepts are equally applicable to a transmissive arrangement where the beam steering and/or focusing elements are transmissive (e.g., for wavelengths longer than SXR).

The options for actuating the moving of the measurement spot with respect to the wafer include moving the focusing mirrors FM in the measurement beam path (as illustrated by the arrows labelled A), moving the substrate table (as illustrated by the arrow labelled B) or by moving the source mirror SM in the drive laser beam path (as illustrated by the arrow labelled C). Any combination of two or more of these options is also possible. In each of these embodiments, as before, the target may be illuminated using semi-random movements, or controlled meandering movements to keep a high spatial resolution.

The first of these options may comprise, more specifically, using the two focusing mirrors (or any suitable beam steering element(s) within the illuminator) to move the measurement spot on the wafer without moving the corresponding detection spots on the detector. Note that this is distinct from standard beam steering (albeit similar) In standard beam steering the pointing and positioning of the beam is controlled in a single location. In this embodiment, two degrees of freedom may be used to control the positioning of the beam at two locations. While moving the beam in this way may mean that the beam is no longer incident on the optimal position on each mirror, which in turn may affect illuminator performance, this will not be a problem as the spot does not need be optimally small for such a method.

The option of moving the substrate table relative to the measurement beam has the benefit of being simple to implement without changing control of the beam, enabling a fixed illuminator.

It is possible to effectively move the source by moving one or more mirrors in the drive beam path. An advantage here is that there are typically at least two mirrors actuatable in at least some SXR designs, which allow for beam steering towards the source. Note that a combination of mirrors may be used to move the spot around on the wafer but not on the detector (this is an extension of standard beam steering). A drawback of this option may be that the source is highly optimized for a specific position within the HHG medium (e.g., HHG gas), so intentionally moving it out of that position may affect source performance (such as power).

In each of these arrangements, the apparatus may be such that it allows inline spot size tuning; for example to enable metrology of both a small calibration target in the scribelane and a large area in-device target, using the same tool.

An embodiment is a method of measuring a property of a structure manufactured by a lithographic process, the method comprising: —irradiating a periodic structure with a beam of radiation along an irradiation direction, the periodic structure having been formed by said lithographic process on a substrate and having a periodicity in at least a first direction, the radiation comprising a plurality of wavelengths in the range of 1-100 nm, the irradiation direction being greater than 2° from a direction parallel to the substrate, wherein the beam of radiation has a spot size of equal to or bigger than 10 μm on the substrate;

detecting a spectrum of radiation reflected by the periodic structure, and processing signals representing the detected spectrum to determine a property of the periodic structure.

Many of the embodiments described above may be combined. For example, the elongated spot may be used in a moving or scanning embodiment (e.g., via the illuminator optics). In this way scanning can be limited to a movement along only one axis, such that the rectangular spot is smeared into effectively measuring a square (or at least longer in the second direction) target, with no smearing in the wavelength direction on the detector. This makes the actuation easier (no meandering needed for example), but makes it harder switch between the large-spot and small-spot modes.

The methods described above are able to achieve some or all of the following benefits (although the embodiment of using the illuminator optics to scan the beam achieves all of these benefits):

Reduced dose while still obtaining the required total number of photons for a measurement, so enabling in-device measurements with HXR/SXR/EUV without resist/device damage;

Optimal use of the measurement area, since it can be illuminated fairly uniformly;

No loss of spectral resolution (spot size on the detector not increased);

Easily switchable to small-target mode for measuring on a calibration target for example (e.g., by not moving the mirrors during illumination);

Wafer stage can be maintained static during illumination;

Applicable to all illumination wavelengths including soft X-ray tools, hard X-ray tools and EUV (e.g., 0.01-100 nm) tools.

The illumination source may be provided in for example a metrology apparatus MT, an inspection apparatus, a lithographic apparatus LA, and/or a lithographic cell LC.

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Further embodiments are disclosed in the subsequent numbered clauses:

1. A method of performing a measurement of an exposed pattern in photoresist on a substrate, the method comprising:

imparting a beam of measurement radiation on said exposed pattern over a measurement area of a size which prevents or mitigates photoresist damage from the measurement radiation, the beam of measurement radiation forming a measurement spot on the substrate;

capturing scattered radiation comprising said measurement radiation subsequent to it having been scattered from said exposed pattern;

detecting the scattered radiation on at least one detector; and determining a value for a parameter of interest from the scattered radiation.

2. A method as claimed in clause 1, wherein the total size of the measurement area from which a single value of the parameter of interest is determined, is no smaller than 1000 $\mu m^2$.

3. A method as claimed in clause 1, wherein the total size of the measurement area from which a single value of the parameter of interest is determined, is no smaller than 2500 $\mu m^2$.

4. A method as claimed in clause 1, wherein the total size of the measurement area from which a single value of the parameter of interest is determined, is no smaller than 0.025 $mm^2$.

5. A method as claimed in clause 1, wherein the total size of the measurement area from which a single value of the parameter of interest is determined, is no smaller than 0.1 $mm^2$.

6. A method as claimed in clause 1, wherein the total size of the measurement area from which a single value of the parameter of interest is determined, is no smaller than 0.25 $mm^2$.

7. A method as claimed in any preceding clause, wherein the measurement area is such that a maximum dose received by the measurement area is 0.01 $J/cm^2$.

8. A method as claimed in any preceding clause, wherein the measurement area is such that a maximum dose received by the measurement area is 1 $mJ/cm^2$.

9. A method as claimed in any preceding clause, wherein the measurement area is such that a maximum dose received by the measurement area is 0.1 $mJ/cm^2$.

10. A method as claimed in any preceding clause, wherein the measurement spot comprises an elongated measurement spot larger in a first dimension than in a second dimension perpendicular to said first dimension.

11. A method as claimed in clause 10, wherein the second dimension corresponds to the direction on said at least one detector along which different wavelengths of the scattered radiation are spatially separated.

12. A method as claimed in any preceding clause, wherein the measurement beam is focused on the at least one detector instead of said substrate.

13. A method as claimed in any preceding clause, wherein a measurement spot formed by said beam of measurement radiation at said substrate comprises an area which is equal to and defines said measurement area.

14. A method as claimed in any of clauses 1 to 12, wherein a measurement spot formed by said beam of measurement radiation at said substrate is smaller than said measurement area and moved over said measurement area during the imparting and capturing steps.

15. A method as claimed in clause 14, wherein said moving of the beam over said measurement area is actuated by actuation of one or both of the measurement beam and substrate.

16. A method as claimed in clause 14 or 15, wherein said movement over said measurement area comprises one or more scans over the measurement area.

17. A method as claimed in clause 16, wherein said one or more scans comprises one or more linear scans.

18. A method as claimed in clause 17, wherein said one or more scans comprises a plurality of linear scans joined to form a meander path over the measurement area.

19. A method as claimed in clause 14 or 15, wherein said moving of the beam over said measurement area comprises a random or semi-random movement of the beam over the measurement area.

20. A method as claimed in any of clauses 14 to 19 wherein said determining a value for the parameter of interest comprises determining an average of all measurement values obtained over the measurement area.

21. A method as claimed in any of clauses 14 to 20, comprising capturing time-resolved measurement data while moving said measurement beam over the measurement area; and forming an image from the time-resolved measurement data.

22. A method as claimed in any of clauses 14 to 21, wherein said measurement beam is a broadband beam generated via high harmonic generation using a drive laser beam; and said moving of the beam over said measurement area is actuated by actuation of a beam steering element in the path of one or both of the measurement beam and drive laser beam.

23. A method as claimed in any of clauses 14 to 22, wherein said moving of the beam is actuated solely by actuation of a beam steering element in the path of the measurement beam.

24. A method as claimed in any of clauses 14 to 22, wherein said moving of the beam is actuated by actuation of a substrate table holding the substrate relative to the measurement beam.

25. A method as claimed in any preceding clause, wherein said measurement beam is a broadband beam generated via high harmonic generation using a drive laser beam.

26. A method as claimed in any preceding clause, wherein the size of the measurement spot on the substrate is tunable.

27. A method as claimed in any preceding clause, wherein a position of the scattered radiation on the at least one detector does not move during said moving of the measurement spot over said measurement area.

28. A method as claimed in any preceding clause, wherein said exposed pattern comprises a pattern of product structure.

29. A method as claimed in any preceding clause, wherein the parameter of interest is one or more of: overlay, focus, edge placement error, critical dimension or any other dimension of the exposed pattern.

30. A method as claimed in any preceding clause, wherein the measurement beam comprises wavelengths of 100 nm or smaller.

31. A method as claimed in any preceding clause, wherein the measurement beam comprises wavelengths of 10 nm or smaller 32. A method as claimed in any preceding clause, wherein different wavelengths of the scattered radiation are at least partially spectrally resolved on the at least one detector.

33. A metrology device for performing a measurement of an exposed pattern in photoresist on a substrate, the metrology device comprising:
an illumination system operable to imparting a beam of measurement radiation on said exposed pattern over a measurement area of a size which prevents or mitigates photoresist damage from the measurement radiation, and such that the beam of measurement radiation forms a measurement spot on the substrate;
at least one detector operable to detect scattered radiation comprising said measurement radiation subsequent to it having been scattered from said exposed pattern; and
a processor operable to determine a value for a parameter of interest from the scattered radiation.

34. A metrology device as claimed in clause 33, wherein the total size of the measurement area from which a single value of the parameter of interest is determined, is no smaller than 1000 $\mu m^2$.

35. A metrology device as claimed in clause 33, wherein the total size of the measurement area from which a single value of the parameter of interest is determined, is no smaller than 2500 $\mu m^2$.

36. A metrology device as claimed in clause 33, wherein the total size of the measurement area from which a single value of the parameter of interest is determined, is no smaller than 0.025 $mm^2$.

37. A metrology device as claimed in clause 33, wherein the total size of the measurement area from which a single value of the parameter of interest is determined, is no smaller than 0.1 $mm^2$.

38. A metrology device as claimed in clause 33, wherein the total size of the measurement area from which a single value of the parameter of interest is determined, is no smaller than 0.25 $mm^2$.

39. A metrology device as claimed in any of clauses 33 to 38, wherein the measurement area is such that a maximum dose received by the measurement area is 0.01 Jim'.

40. A metrology device as claimed in any of clauses 33 to 38, wherein the measurement area is such that a maximum dose received by the measurement area is 1 $mJ/cm^2$.

41. A metrology device as claimed in any of clauses 33 to 38, wherein the measurement area is such that a maximum dose received by the measurement area is 0.1 $mJ/cm^2$.

42. A metrology device as claimed in any of clauses 33 to 41, wherein the illumination system is operable to form an elongated measurement spot of said measurement radiation on said substrate which is larger in a first dimension than in a second dimension perpendicular to said first dimension.

43. A metrology device as claimed in clause 42, wherein the second dimension corresponds to the direction on said at least one detector along which different wavelengths of the scattered radiation are spatially separated.

44. A metrology device as claimed in any of clauses 33 to 43, wherein the illumination system is operable to focus said measurement beam on the at least one detector instead of said substrate.

45. A metrology device as claimed in any of clauses 33 to 44, wherein the illumination system is operable to form the measurement spot on said substrate with an area which is equal to and defines said measurement area.

46. A metrology device as claimed in any of clauses 33 to 44, wherein the illumination system is operable to form the measurement spot on said substrate with an area smaller than said measurement area, and wherein the metrology device is further operable to move the measurement spot over said measurement area during a measurement.

47. A metrology device as claimed in clause 46, being operable such that said moving of the beam over said measurement area is actuated by actuation of one or both of the measurement beam and a substrate table operable to hold said substrate.

48. A metrology device as claimed in clause 47, wherein said moving of the beam is actuated by actuation of the substrate table relative to the measurement beam.

49. A metrology device as claimed in clause 46, 47 or 48, being operable such that said movement over said measurement area comprises one or more scans over the measurement area.

50. A metrology device as claimed in clause 49, being operable such that said one or more scans comprises one or more linear scans.

51. A metrology device as claimed in clause 50, being operable such that said one or more scans comprises a plurality of linear scans joined to form a meander path over the measurement area.

52. A metrology device as claimed in clause 46, 47 or 48, being operable such that said moving of the beam over said measurement area comprises performing a random or semi-random movement of the beam over the measurement area.

53. A metrology device as claimed in any of clauses 46 to 52 wherein said processor is operable to determining the value for the parameter of interest from an average of all measurement values obtained over the measurement area.

54. A metrology device as claimed in any of clauses 46 to 53, being operable to capture time-resolved measurement data while moving said measurement beam over the measurement area; and form an image from the time-resolved measurement data.

55. A metrology device as claimed in any of clauses 46 to 54, comprising:
a high harmonic generation medium; and
a drive laser beam delivery system to deliver a drivel laser beam to the high harmonic generation medium said measurement beam is a broadband beam generated via high harmonic generation using a drive laser beam; wherein said drive laser beam delivery system is comprises at least one beam steering element in the path of one or both of the measurement beam and drive laser beam; and
said moving of the beam over said measurement area is actuated by actuation of the at least one beam steering element.

56. A metrology device as claimed in any of clauses 46 to 54, wherein said illumination system comprises at least one beam steering element in the path of the measurement beam; and said moving of the beam is actuated solely by actuation of the at least one beam steering element.

57. A metrology device as claimed in any of clauses 33 to 54 or 56, comprising:
a high harmonic generation medium; and
a drive laser beam delivery system to deliver a drivel laser beam to the high harmonic generation medium said measurement beam is a broadband beam generated via high harmonic generation using a drive laser beam.

58. A metrology device as claimed in any of clauses 33 to 57, being operable such that the size of the measurement spot on the substrate is tunable.

59. A metrology device as claimed in any of clauses 33 to 58, being operable such that a position of the scattered radiation on the at least one detector does not move during said moving of the measurement spot over said measurement area.

60. A metrology device as claimed in any of clauses 33 to 59, wherein the parameter of interest is one or more of: overlay, focus, edge placement error, critical dimension or any other dimension of the exposed pattern.

61. A metrology device as claimed in any of clauses 33 to 60, being operable such that the measurement beam comprises wavelengths of 100 nm or smaller.

62. A metrology device as claimed in any of clauses 33 to 61, being operable such that the measurement beam comprises wavelengths of 10 nm or smaller.

63. A metrology device as claimed in any of clauses 33 to 62, being operable such that different wavelengths of the scattered radiation are at least partially spectrally resolved on the at least one detector.

64. A computer program comprising program instructions operable to perform the method of any of claims 1 to 32, when run on a suitable apparatus.

65. A non-transient computer program carrier comprising the computer program of clause 64.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to HXR, SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays.

The invention claimed is:

1. A method of performing a measurement of an exposed pattern in photoresist on a substrate, the method comprising:
   imparting a beam of measurement radiation on the exposed pattern over a measurement area of a size equal to or bigger than 100 $\mu m^2$ for preventing or mitigating photoresist damage from the measurement radiation, the beam of measurement radiation forming a measurement spot on the substrate;
   capturing scattered radiation comprising the measurement radiation subsequent to it having been scattered from said exposed pattern;
   detecting the scattered radiation on at least one detector; and
   determining a value of a parameter of interest from the scattered radiation.

2. The method of claim 1, wherein the total size of the measurement area from which a single value of the parameter of interest is determined, is no smaller than 200 $\mu m^2$, 500 $\mu m^2$, 1000 $\mu m^2$, 2500 $\mu m^2$, 0.025 $mm^2$, 0.1 $mm^2$, or 0.25 $mm^2$.

3. The method of claim 1, wherein the measurement area is such that a maximum dose received by the measurement area is 0.01 $J/cm^2$, 1 $mJ/cm^2$, or 0.1 $mJ/cm^2$.

4. The method of claim 1, wherein the measurement spot comprises an elongated measurement spot larger in a first dimension than in a second dimension perpendicular to said first dimension, and wherein, the second dimension corresponds to a direction on said at least one detector along which different wavelengths of the scattered radiation are spatially separated.

5. The method of claim 1, wherein the beam of measurement radiation is focused on the at least one detector instead of said substrate.

6. The method of claim 1, wherein the measurement spot formed by said beam of measurement radiation at said substrate comprises an area that is equal to and defines said measurement area.

7. The method of claim 1, wherein
   the measurement spot formed by the beam of measurement radiation at the substrate is smaller than said measurement area and moved over said measurement area during the imparting and capturing steps,
   wherein the moving of the beam of measurement radiation over the measurement area is actuated by actuation of one or both of the beam of measurement radiation and substrate,
   wherein the movement over said measurement area comprises one or more scans over the measurement area,
   wherein the one or more scans comprises one or more linear scans, and
   wherein the one or more scans comprises a plurality of linear scans joined to form a meander path over the measurement area.

8. The method of claim 7, wherein the determining the value for the parameter of interest comprises determining an average of all measurement values obtained over the measurement area.

9. The method of claim 7, further comprising:
   capturing time-resolved measurement data while moving said beam of measurement radiation over the measurement area; and
   forming an image from the time-resolved measurement data.

10. The method of claim 1, wherein imparting the beam of measurement radiation comprises imparting a broadband beam generated by high harmonic generation using a drive laser beam.

11. The method of claim 1, wherein a position of the scattered radiation on the at least one detector does not move during said moving of the measurement spot over said measurement area.

12. The method of claim 1, wherein imparting the beam of measurement radiation comprises imparting the beam of measurement radiation with wavelengths of 100 nm or smaller, or 20 nm or smaller.

13. A metrology device for performing a measurement of an exposed pattern in photoresist on a substrate, the metrology device comprising:
   an illumination system operable to impart a beam of measurement radiation on the exposed pattern over a measurement area of a size which prevents or mitigates photoresist damage from the measurement radiation, and such that the beam of measurement radiation forms a measurement spot on the substrate;
   at least one detector operable to detect scattered radiation comprising the measurement radiation subsequent to it having been scattered from the exposed pattern; and
   a processor operable to determine a value for a parameter of interest from the scattered radiation.

14. A computer program comprising program instructions operable to perform the method of claim 1, when run on one or more processors.

15. The method of claim 1, wherein different wavelengths of the scattered radiation are at least partially spectrally resolved on the at least one detector.

* * * * *